(12) United States Patent
Shin et al.

(10) Patent No.: US 11,108,412 B2
(45) Date of Patent: Aug. 31, 2021

(54) MEMORY SYSTEMS AND METHODS OF CORRECTING ERRORS IN THE MEMORY SYSTEMS

(71) Applicant: SK hynix Inc., Icheon-si (KR)

(72) Inventors: Won Gyu Shin, Seoul (KR); Jin Woong Suh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/726,693

(22) Filed: Dec. 24, 2019

(65) Prior Publication Data

US 2020/0382137 A1 Dec. 3, 2020

(30) Foreign Application Priority Data

May 29, 2019 (KR) .................. 10-2019-0063100

(51) Int. Cl.
*H03M 13/15* (2006.01)
*G06F 9/30* (2018.01)
*G06F 11/10* (2006.01)
*H03M 13/11* (2006.01)

(52) U.S. Cl.
CPC ...... *H03M 13/154* (2013.01); *G06F 9/30029* (2013.01); *G06F 11/1044* (2013.01); *G06F 11/1068* (2013.01); *H03M 13/1148* (2013.01); *H03M 13/1515* (2013.01)

(58) Field of Classification Search
CPC .................................................. H03M 13/154

USPC ........................................................ 714/784
See application file for complete search history.

(56) References Cited

U.S. PATENT DOCUMENTS

| | | | | |
|---|---|---|---|---|
| 5,271,022 A * | 12/1993 | Berlekamp | ............ | G03B 31/02 386/E9.045 |
| 6,112,324 A * | 8/2000 | Howe | ................ | G11B 20/1217 707/999.202 |
| 8,473,826 B1 | 6/2013 | Caldwell | | |
| 9,432,298 B1 * | 8/2016 | Smith | ................ | H04L 49/9057 |
| 2004/0190085 A1 * | 9/2004 | Silverbrook | ........ | G06F 3/03545 358/474 |
| 2004/0190092 A1 * | 9/2004 | Silverbrook | ....... | H04N 1/00376 358/539 |

* cited by examiner

*Primary Examiner* — Fritz Alphonse
(74) *Attorney, Agent, or Firm* — William Park & Associates Ltd.

(57) ABSTRACT

A memory system includes a Reed-Solomon (RS) decoder, a reliability tracking circuit, and an erasure control circuit. The RS decoder performs an error correction decoding operation of 'K'-number of symbols outputted from a memory medium. The reliability tracking circuit generates and stores information on a reliability of the symbols, error occurrence possibilities of which are distinguished into a plurality of different levels according to the error correction decoding operation performed by the RS decoder. The erasure control circuit controls the RS decoder such that the symbols are erased in order of the reliability of the symbols from a low reliable symbol to a high reliable symbol and the error correction decoding operation is performed according to the information on the reliability of the symbols stored in the reliability tracking circuit.

20 Claims, 16 Drawing Sheets

| | SB0 | SB1 | SB2 | SB3 | SB4 | SB5 | SB6 | SB7 | SB8 | SB9 | SB10 | SB11 | SB12 | SB13 | SB14 | SB15 |
|---|---|---|---|---|---|---|---|---|---|---|---|---|---|---|---|---|
| LRS | 0 | 1 | 0 | 0 | 0 | 0 | 0 | 0 | 0 | 0 | 0 | 0 | 0 | 0 | 0 | 1 |
| SRS | 1 | 1 | 0 | 1 | 1 | 1 | 1 | 0 | 1 | 0 | 1 | 0 | 1 | 1 | 0 | 1 |
| MRS | 0 | 0 | 1 | 0 | 0 | 0 | 0 | 1 | 0 | 1 | 0 | 1 | 0 | 0 | 1 | 0 |

MEMORY SYSTEMS AND METHODS OF CORRECTING ERRORS IN THE MEMORY SYSTEMS

CROSS-REFERENCE TO RELATED APPLICATIONS

The present application claims priority under 35 U.S.C 119(a) to Korean Application No. 10-2019-0063100, filed on May 29, 2019, which is herein incorporated by references in its entirety.

BACKGROUND

1. Technical Field

Various embodiments of the disclosed technology generally relate to memory systems and, more particularly, to memory systems and methods of correcting errors in the memory systems.

2. Related Art

In general, a path transmitting information is called a channel. When the information is transmitted using cable communication, a transmission line through which the information is transmitted may act as the channel. When the information is transmitted using wireless communication, the channel may be air in which electromagnetic waves including the information are propagated. Processes for storing data into memory devices and for reading out the data from the memory devices may be performed through the channel.

When the data are transmitted through the channel, an error may be included in the data. Thus, a lot of effort has been continuously focused on developing devices and methods for detecting errors from erroneous data and for removing the detected errors to restore the erroneous data to their original data. An error correction code (ECC) encoding operation and an ECC decoding operation have been widely used in memory systems including the memory devices. The ECC encoding operation may correspond to a process for generating transmission data by adding an error control code (or the error correction code) to original data (i.e., write data) before the original data are transmitted. The ECC decoding operation may correspond to a process for performing a read operation to read out data stored in the memory device and for separating the read data into the original data and the added code to restore the read data to the original data.

SUMMARY

According to an embodiment, a memory system includes a Reed-Solomon (RS) decoder, a reliability tracking circuit and an erasure control circuit. The RS decoder may be configured to perform an error correction decoding operation of 'K'-number of symbols outputted from a memory medium (where, 'K' denotes a natural number). The reliability tracking circuit may be configured to generate and store information on a reliability of the symbols, error occurrence possibilities of which are distinguished into a plurality of different levels according to the error correction decoding operation performed by the RS decoder. The erasure control circuit may be configured to control the RS decoder such that the symbols are erased in order of the reliability of the symbols from a low reliable symbol to a high reliable symbol and the error correction decoding operation is performed according to the information on the reliability of the symbols stored in the reliability tracking circuit.

According to another embodiment, there is provided a method of correcting erroneous data in a memory system. The method may include generating and storing information on a reliability of symbols, error occurrence possibilities of which are distinguished into a plurality of different levels according to a result of a Reed-Solomon (RS) decoding operation of the symbols outputted from a memory medium. The symbols may be erased in order of the symbol reliability from a low reliable symbol to a high reliable symbol, and the RS decoding operation may be performed according to the information on the reliability of the symbols.

BRIEF DESCRIPTION OF THE DRAWINGS

Certain features of the disclosed technology are illustrated by various embodiments with reference to the attached drawings, in which:

FIG. 4 is a schematic view illustrating a first reliability tracking table of a reliability tracking circuit included in a memory system according to an embodiment of the present disclosure;

FIG. 13 is a table illustrating a reliability distribution of symbols inputted to an erasure control circuit during the symbol tracking processes shown in FIGS. 6 to 12;

DETAILED DESCRIPTION

Figure 1:
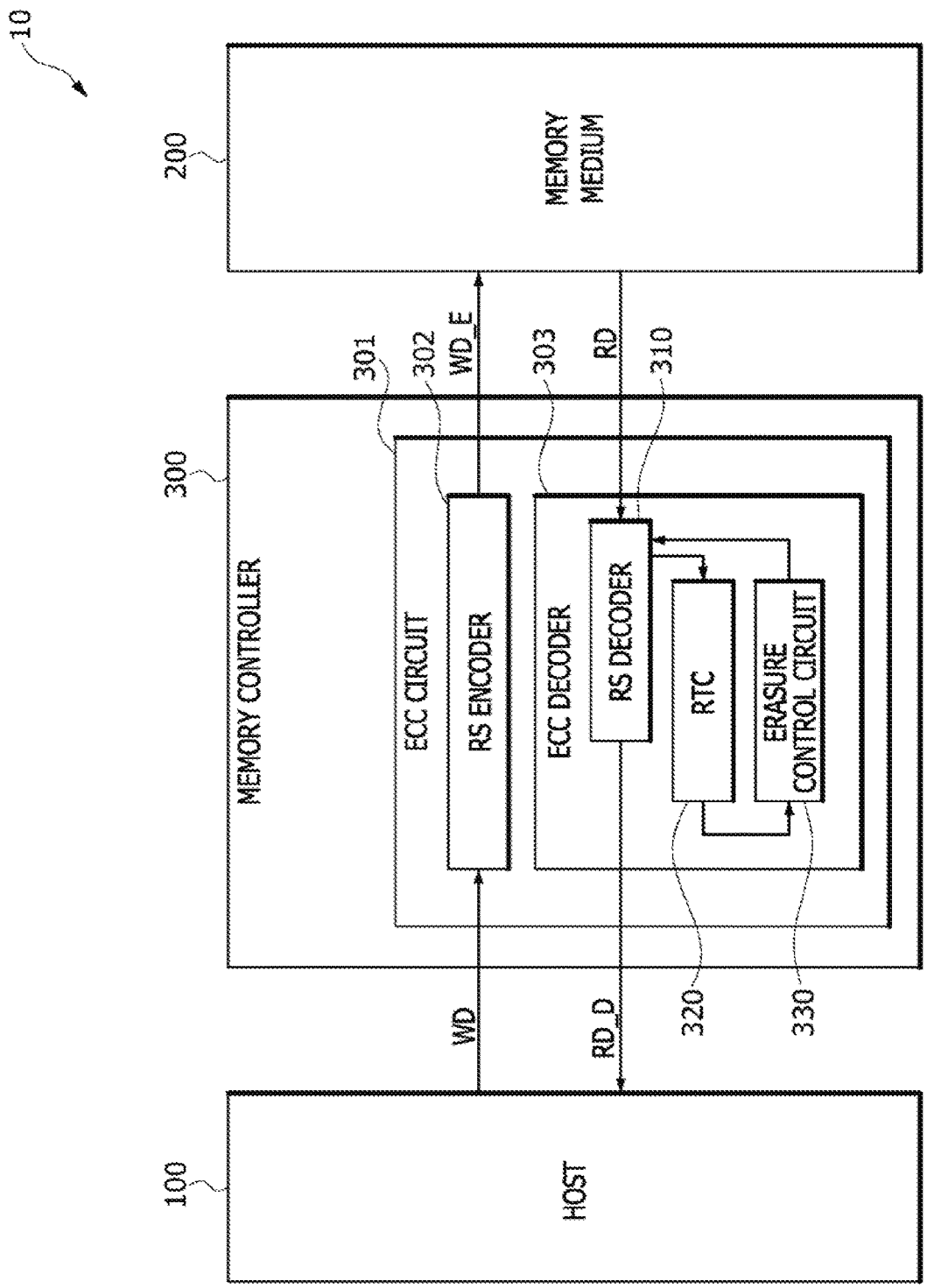
FIG. 1 is a block diagram illustrating an example of a memory system according to an embodiment of the present disclosure.

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

A Reed-Solomon (RS) decoding method may use an error correction code (ECC) to correct errors in units of symbols. In general, the RS decoding method may be classified into two categories. One is an RS hard-decision decoding (hereinafter, referred to as 'RS-HDD') method which is based on mathematical rules, and the other is an RS soft-decision decoding (hereinafter, referred to as 'RS-SDD') method which is based on reliability information of symbols. The RS-HDD method may use a mathematical algorithm such as a Berlekamp-Messey algorithm (BMA), a Chien-Search (CS) algorithm or a Forney-Method (FM) algorithm, and the number of correctable symbols may be determined by mathematical rules. In contrast, according to the RS-SDD method, not that the number of correctable symbols is determined, but that probability distribution of correctable symbols according to various conditions is determined. Thus, in case of the RS-SDD method, information on the reliability of symbols constituting a codeword may be used. The codeword may be defined as a unit of data to which the ECC is applied.

An RS-erasure method may be used as a means of the RS-HDD for efficiently performing a fixed error correction operation. The RS-erasure method may be an algorithm which is used in case that a location of an erroneous symbol is known. Thus, in the event that the RS-erasure method is used, only one parity symbol for finding out an error may be used. For example, a case of RS (32, 24), that is, a case that a codeword includes thirty-two symbols comprised of twenty-four data symbols and eight parity symbols will be described hereinafter. Because the number of the parity symbols is eight, two parity symbols may be used to obtain locations and values of errors when the locations and the values of errors are not known (that is, when random-erroneous symbols have to be corrected). Accordingly, it may be possible to correct four erroneous symbols. However, in case that locations of two errors are known, only two parity symbols may be used to correct the two fixed error symbols. Thus, it may be possible to correct three random-erroneous symbols using the remaining six parity symbols. Accordingly, in this case, it may be possible to correct five erroneous symbols in total. Similarly, when locations of four errors are known, it may be possible to correct six erroneous symbols including four fixed erroneous symbols and two random-erroneous symbols in total.

According to various embodiments of the present disclosure, there may be provided memory systems which are capable of correcting errors by using the RS-SDD method repeatedly performing the RS-HDD method with changing the locations and the number of fixed erroneous symbols and methods of correcting the erroneous symbols in the memory systems. In order to change the locations and the number of the fixed erroneous symbols, the locations and the number of symbols to be erased may be changed. In such a case, an efficiency the RS-SDD method may be improved by using information on the reliability of symbols in sorting the symbols to be erased. The information on the reliability of the symbols may be generated by performing a reliability tracking operation while the RS-HDD method is used. Processes for tracking the reliability of symbols and processes for correcting errors using the tracking processes will be described hereinafter with reference to the accompanying drawings.

FIG. 1 is a block diagram illustrating a memory system 10 according to an embodiment of the present disclosure. Referring to FIG. 1, the memory system 10 may be configured to include a host 100, a memory medium 200 and a memory controller 300. The host 100 may transmit write data WD to the memory controller 300 or may receive decoded read data RD_D from the memory controller 300. The host 100 may also transmit various commands for accessing to the memory medium 200 to the memory controller 300. The memory medium 200 may include a volatile memory device such as a dynamic random access memory (DRAM) device. The memory medium 200 may also include a nonvolatile memory device such as a flash memory device, a phase change memory (PCRAM) device, a resistive memory (ReRAM) device, a ferroelectric memory (FeRAM) device or a magnetic memory (MRAM) device.

The memory controller 300 may perform an operation for accessing to the memory medium 200 in response to a command outputted from the host 100. The memory controller 300 may include an ECC circuit 301. The ECC circuit 301 may include an RS encoder 302 and an ECC decoder 303. In an embodiment, the ECC decoder 303 may include an RS decoder 310, a reliability tracking circuit (RTC) 320 and an erasure control circuit 330. During a write operation of the memory medium 200, the RS encoder 302 may perform an RS encoding operation of the write data WD outputted from the host 100 to generate a codeword (i.e., encoded write data WD_E) comprised of data symbols and parity symbols. The memory controller 300 may perform an operation for writing the encoded write data WD_E into the memory medium 200. During a read operation of the memory medium 200, the RS decoder 310 may perform an RS decoding operation of read data RD which are read out from the memory medium 200 to output the decoded read data RD_D having an error that is corrected when the read data RD are erroneous data. The memory controller 300 may transmit the decoded read data RD_D to the host 100.

While the RS decoding operation is performed by the RS decoder 310, the reliability tracking circuit (RTC) 320 may generate and store information on the reliability of the symbols. The information on the reliability of the symbols may be defined as information for distinguishing the symbols into a plurality of different levels indicating error occurrence possibilities. In an embodiment, each of the symbols may be classified into any one of a least reliable symbol (hereinafter, referred to as 'LRS'), a suspicious reliable symbol (hereinafter, referred to as 'SRS') and a most reliable symbol (hereinafter, referred to as 'MRS'). When an erroneous symbol is not corrected by the RS decoding method, the erasure control circuit 330 may control the RS decoder 310 such that an RS-erasure-based RS-HDD operation is performed according to the reliability information stored in the reliability tracking circuit (RTC) 320. The RS-erasure-based RS-HDD operation may be defined as a process that the RS decoding operation is repeatedly performed until the error is corrected while the symbols are erased in order of the symbol reliability from a low reliable symbol toward a high reliable symbol.

Figure 2:
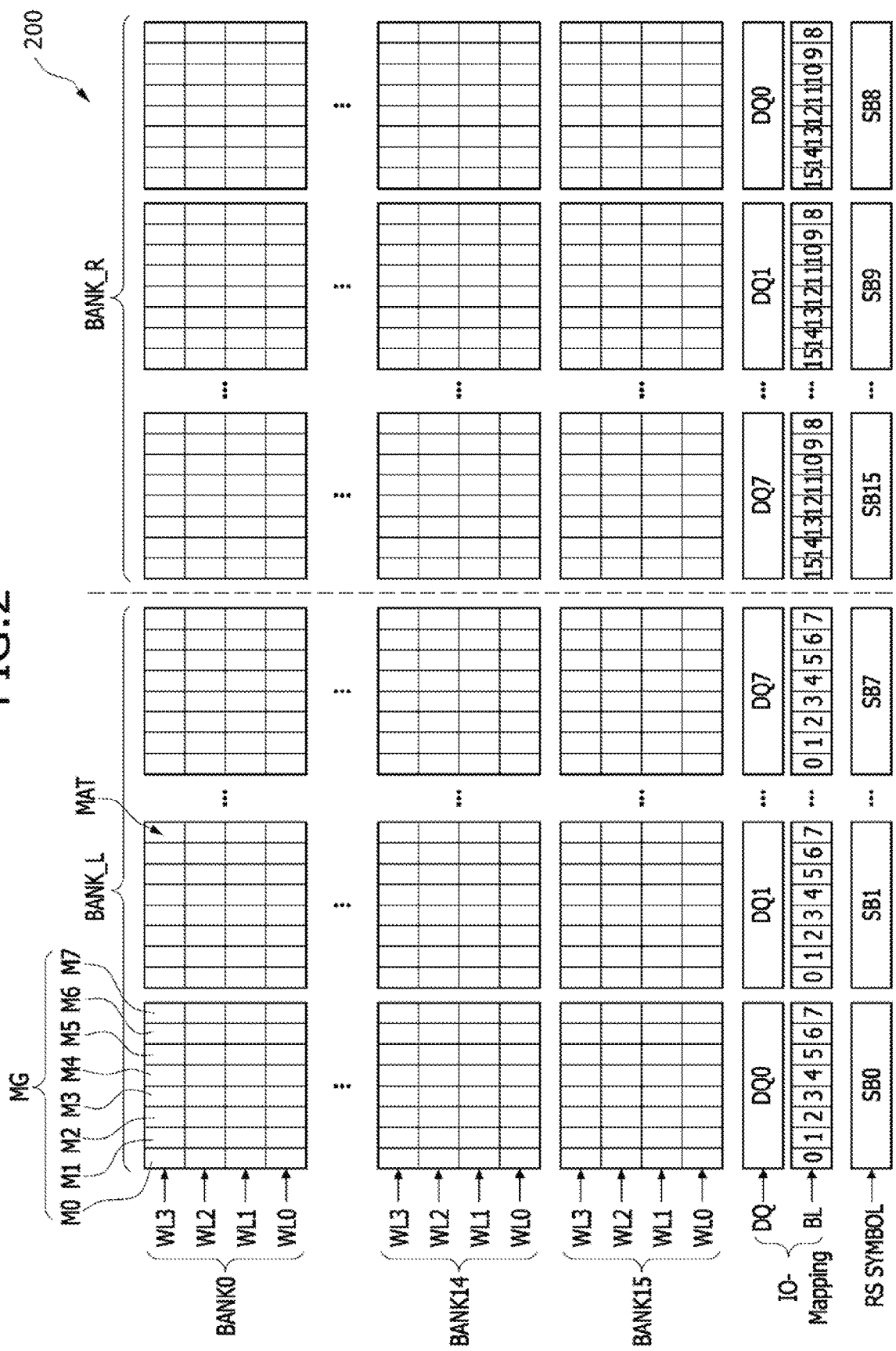
FIG. 2 is a schematic view illustrating a configuration of a memory medium included in a memory system according to an embodiment of the present disclosure.

FIG. 2 is a schematic view illustrating a configuration of the memory medium 200 included in the memory system 10 of FIG. 1. Referring to FIG. 2, the memory medium 200 may include a plurality of banks, for example, sixteen banks (i.e., first to sixteenth banks BANK0, . . . , BANK14 and BANK 15). In an embodiment, the memory medium 200 may be realized to have a memory chip form. In such a case, the memory medium 200 may be realized to have a memory module form including a plurality of memory chips. Each of the first to sixteenth banks BANK0, . . . , BANK14 and BANK 15 may include a plurality of matrixes MATs which are arrayed in rows and columns. Each of the matrixes MATs may have a cell array structure in which a plurality of memory cells are arrayed. The matrixes MATs arrayed in one row may have the same row address. For example, the matrixes arrayed in first rows of the first to sixteenth banks BANK0, . . . , BANK14 and BANK15 may have a first row address WL0, and the matrixes arrayed in second rows of the first to sixteenth banks BANK0, . . . , BANK14 and BANK15 may have a second row address WL1. Similarly, the matrixes arrayed in third rows of the first to sixteenth banks BANK0, . . . , BANK14 and BANK15 may have a third row address WL2, and the matrixes arrayed in fourth rows of the first to sixteenth banks BANK0, . . . , BANK14 and BANK15 may have a fourth row address WL3. Each of the first to fourth row addresses WL0-WL3 may include a word line address that is able to designate memory cells arrayed in a row among the memory cells in the matrixes MATs.

Eight matrixes (i.e., first to eighth matrixes M0-M7) adjacent to each other among the matrixes MATs having the same row address in each of the first to sixteenth banks BANK0-BANK15 may constitute one matrix group MG. Each matrix group MG may receive or output data through one data input/output (I/O) pin DQ. In an embodiment, the memory medium 200 may have 'K'-number of data I/O pins, for example, sixteen data I/O pins (i.e., first to eighth data I/O pins DQ0-DQ7 of a left bank BANK_L and first to eighth data I/O pins DQ0-DQ7 of a right bank BANK_R) (where, the number 'K' denotes a natural number). One data I/O pin DQ may receive or output 'N'-bit data, for example, 8-bit data corresponding to a burst length BL of '8' (where, the number 'N' denotes a natural number). Because one-bit datum is outputted from or inputted to one matrix MAT, 8-bit data may be transmitted through one data I/O pin DQ. 8-bit data outputted through one data I/O pin DQ (i.e., 8-bit data outputted from one matrix group MG) may constitute one RS symbol. For example, the first to eighth matrixes M0-M7 adjacent to each other among the matrixes sharing the fourth row address WL3 of the first bank BANK0 may constitute one matrix group MG. Because one-bit datum is outputted from each of the first to eighth matrixes M0-M7 constitute one matrix group MG, 8-bit data may be outputted through the first data I/O pin DQ0. The 8-bit data outputted through the first data I/O pin DQ0 may constitute a first RS symbol SB0.

In the present embodiment, the matrixes in each of the banks BANK0, . . . , BANK14 and BANK15 may be divided into two groups by a vertical dotted line to provide the left bank BANK_L and the right bank BANK_R. The left bank BANK_L may include eight matrix groups, which are sequentially disposed, from a first matrix group connected to the first data I/O pin DQ0 to an eighth matrix group connected to the eighth data I/O pin DQ7. The right bank BANK_R may also include eight matrix groups, which are sequentially disposed, from an eighth matrix group connected to another eighth data I/O pin DQ7 to a first matrix group connected to another first data I/O pin DQ0. Accordingly, 64-bit data may be outputted from the left bank BANK_L through the eight data I/O pins DQ0-DQ7. The 64-bit data outputted from the left bank BANK_L may constitute eight RS symbols (i.e., first to eighth RS symbols SB0-SB7). Similarly, 64-bit data may be outputted from the right bank BANK_R through the other eight data I/O pins DQ0-DQ7. The 64-bit data outputted from the right bank BANK_R may constitute eight RS symbols SB8-SB15 (i.e., ninth to sixteenth RS symbols SB8-SB15). As a whole, 'K×N'-bit data, that is, 128-bit data may be outputted from the memory medium 200 by a single read operation, and the 128-bit data may constitute sixteen RS symbols (i.e., the first to sixteenth RS symbols SB0-SB15).

Figure 3:
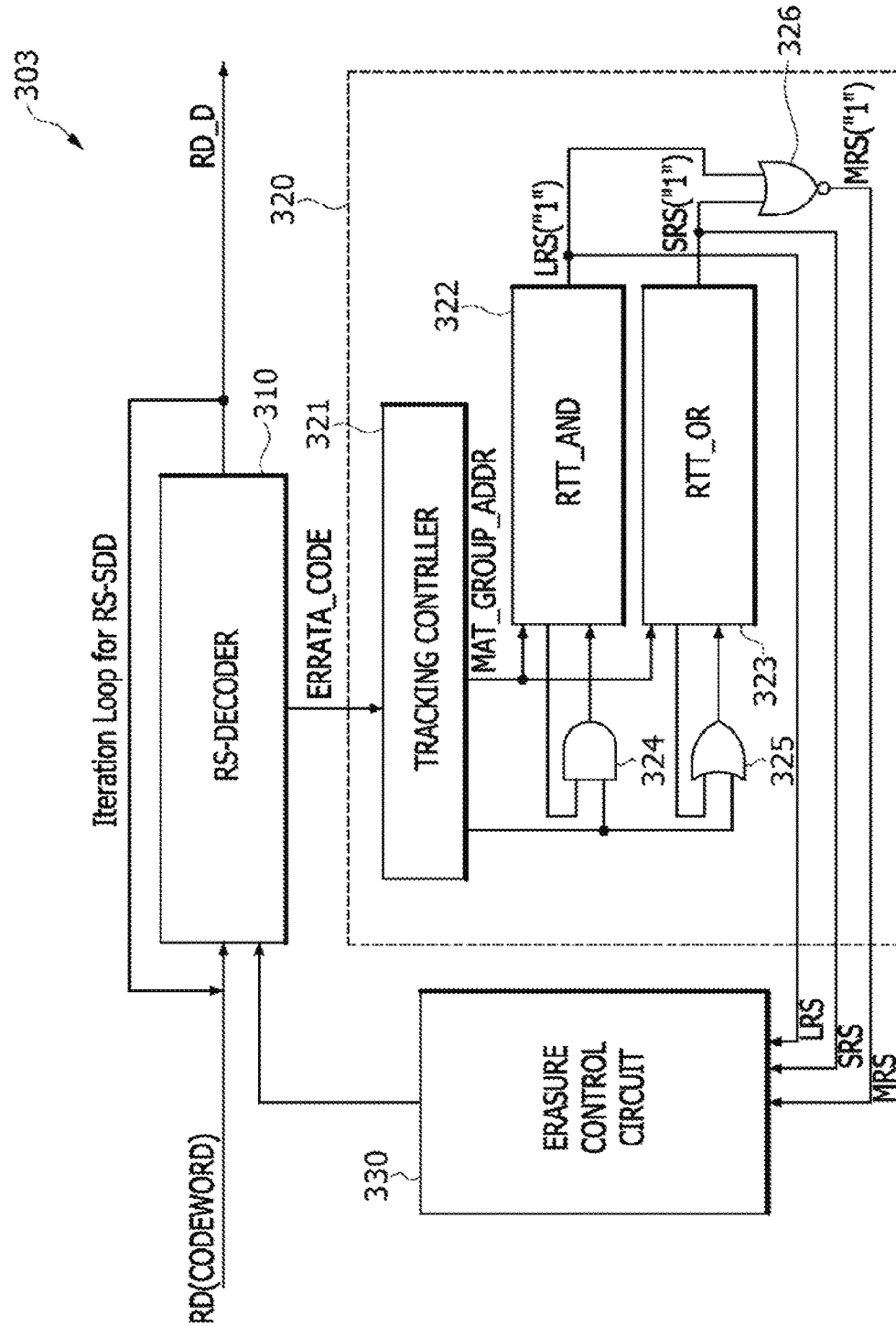
FIG. 3 is a schematic view illustrating a configuration of an error correction code (ECC) decoder included in a memory system according to an embodiment of the present disclosure.

FIG. 3 is a schematic view illustrating a configuration of the ECC decoder 303 included in the memory system 10 of FIG. 1. Referring to FIG. 3, the ECC decoder 303 may be configured to include the RS decoder 310, the RTC 320 and the erasure control circuit 330. The RS decoder 310 may perform the RS decoding operation of the read data RD (i.e., a codeword) outputted from the memory medium (200 of FIG. 1). In an embodiment, as described with reference to FIG. 2, the read data RDATA inputted to the RS decoder 310 may include 16-byte data (i.e., 128-bit data) constituting 16 RS symbols when 128-bit data (i.e., 16 RS symbols) are outputted from the memory medium 200. In addition, the read data RDATA may further include data constituting parity symbols. The RS decoder 310 may output the decoded read data RD_D whose error is corrected by the RS decoding operation. The RS decoder 310 may be configured to perform an RS-HDD operation. Although not shown in the drawings, the RS decoder 310 may be configured to include a syndrome arithmetic element, an error location polynomial arithmetic element, an error location arithmetic element and an error correction arithmetic element. Because q configuration of the RS decoder 310 is well known in the art, an additional description of the RS decoder 310 will be omitted hereinafter.

A certain number of erroneous symbols may be corrected by the RS-HDD operation of the RS decoder 310. For example, if an error correction capability is '10', only ten or less erroneous symbols may be corrected but eleven or more erroneous symbols cannot be corrected. The RS decoder 310 may output an error code ERRATA_CODE including information on errors generated by the RS-HDD operation. The error code ERRATA_CODE may be comprised of a binary stream having the same number of bits as the read data RDATA. For example, if the read data RDATA have 128 bits, the error code ERRATA_CODE may also be comprised of a binary stream having 128 bits. The error code ERRATA_CODE may have the same bit value in units of 8 bits. For example, when an error exists in the first symbol SB0, an 8-bit binary stream corresponding to the first symbol SB0 in the error code may include eight bits having a bit value of "1". In contrast, when no error exists in the first symbol SB0, an 8-bit binary stream corresponding to the first symbol SB0 in the error code may include eight bits having a bit value of "0".

The RTC 320 may be configured to include a tracking controller 321, a first reliability tracking table 322, a second reliability tracking table 323, a first logic arithmetic element 324, a second logic arithmetic element 325 and a third logic arithmetic element 326. The tracking controller 321 may receive the error code ERRATA_CODE from the RS decoder 310 to discriminate whether a reliability tracking process has to be performed. If the reliability tracking process has to be performed, the tracking controller 321 may output a matrix group address MAT_GROUP_ADDR and error location data including error locations of the matrix groups MGs. The matrix group address MAT_GROUP_ADDR may be inputted to the first reliability tracking table (RTT_AND) 322 and the second reliability tracking table (RTT_OR) 323. The error location data may be inputted to both of one input terminal (e.g., a first input terminal) of the first logic arithmetic element 324 and one input terminal (e.g., a first input terminal) of the second logic arithmetic element 325. The error location data may be comprised of a binary stream in which an error location of each matrix group MG is expressed by one bit value. Because data outputted from one matrix group MG constitute one symbol, the error location data may include error locations of the symbol. In an embodiment, when the read data RDATA have 128 bits, the error location data may be comprised of a 16-bit binary stream.

The first reliability tracking table (RTT_AND) 322 may be comprised of a storage medium in which first reliability information is stored, and the second reliability tracking table (RTT_OR) 323 may be comprised of a storage medium in which second reliability information is stored. The first reliability information may be defined as information on a location of the LRS. The second reliability information may be defined as information on a location of the SRS. Each of the first reliability information and the second reliability information may be comprised of a value of one bit per one matrix group MG in the memory medium (200 of FIG. 1). Thus, each of the first reliability tracking table (RTT_AND) 322 and the second reliability tracking table (RTT_OR) 323 may have a storage capacity of the same number of bits as the matrix groups (i.e., the symbols) in the memory medium (200 of FIG. 1). Bit values having the matrix group address MAT_GROUP_ADDR outputted from the tracking controller 321 among bit values in the first reliability tracking table (RTT_AND) 322 may be inputted to the other input terminal (e.g., a second input terminal) of the first logic arithmetic element 324. Bit values having the matrix group address MAT_GROUP_ADDR outputted from the tracking controller 321 among bit values in the second reliability tracking table (RTT_OR) 323 may be inputted to the other input terminal (e.g., a second input terminal) of the second logic arithmetic element 325.

The first logic arithmetic element 324 may be realized using a logical AND gate. The second logic arithmetic element 325 may be realized using a logical OR gate. The third logic arithmetic element 326 may be realized using a logical NOR gate. Alternatively, the third logic arithmetic element 326 may be realized using a logical NAND gate. The first logic arithmetic element 324 may perform a logical AND operation of the error location data outputted from the tracking controller 321 and the bit values of the first reliability information outputted from the first reliability tracking table (RTT_AND) 322 to generate and output updated information of the first reliability information. The updated first reliability information outputted from the first logic arithmetic element 324 may be inputted to the first reliability tracking table (RTT_AND) 322. The first reliability tracking table (RTT_AND) 322 may replace the first reliability information currently stored therein with the updated first reliability information outputted from the first logic arithmetic element 324. The second logic arithmetic element 325 may perform a logical OR operation of the error location data outputted from the tracking controller 321 and the bit values of the second reliability information outputted from the second reliability tracking table (RTT_OR) 323 to generate and output updated information of the second reliability information. The updated second reliability information outputted from the second logic arithmetic element 325 may be inputted to the second reliability tracking table (RTT_OR) 323. The second reliability tracking table (RTT_OR) 323 may replace the second reliability information currently stored therein with the updated second reliability information outputted from the second logic arithmetic element 325.

The updated first reliability information in the first reliability tracking table (RTT_AND) 322 and the updated second reliability information in the second reliability tracking table (RTT_OR) 323 may be inputted to the erasure control circuit 330 as well as the third logic arithmetic element 326. The updated first reliability information may be comprised of a binary stream having a bit value of "0" or "1" for each of the symbols, and a symbol having a bit value of "1" may be classified into the LRS. The updated second reliability information may also be comprised of a binary stream having a bit value of "0" or "1" for each of the symbols, and a symbol having a bit value of "1" may be classified into the SRS. The third logic arithmetic element 326 may perform a logical NOR operation of the updated first reliability information and the updated second reliability information and may output the result of the logical NOR operation to the erasure control circuit 330. The output data of the third logic arithmetic element 326 may also be comprised of a binary stream having a bit value of "0" or "1" for each of the symbols, and a symbol having a bit value of "1" may be classified into the MRS. In another embodiment, when the third logic arithmetic element 326 is realized using a logical NAND gate, a symbol having a bit value of "0" among the output data of the third logic arithmetic element 326 may be classified into the MRS.

The erasure control circuit 330 may sort the symbols in order of the symbol reliability from a low reliable symbol to a high reliable symbol (i.e., in sequence of the LRS, the SRS and the MRS) based on the updated first reliability information outputted from the first reliability tracking table (RTT_AND) 322, the updated second reliability information outputted from the second reliability tracking table (RTT_OR) 323, and the output data outputted from the third logic arithmetic element 326. In addition, the erasure control circuit 330 may control the RS decoder 310 such that the RS-SDD operation is performed to erase and correct the symbols in sequence of the LRS, the SRS and the MRS. The RS decoder 310 may repeatedly perform the RS decoding operation with increasing the number of the erased symbols until errors are corrected, in response to a control signal of the erasure control circuit 330.

Figure 4:
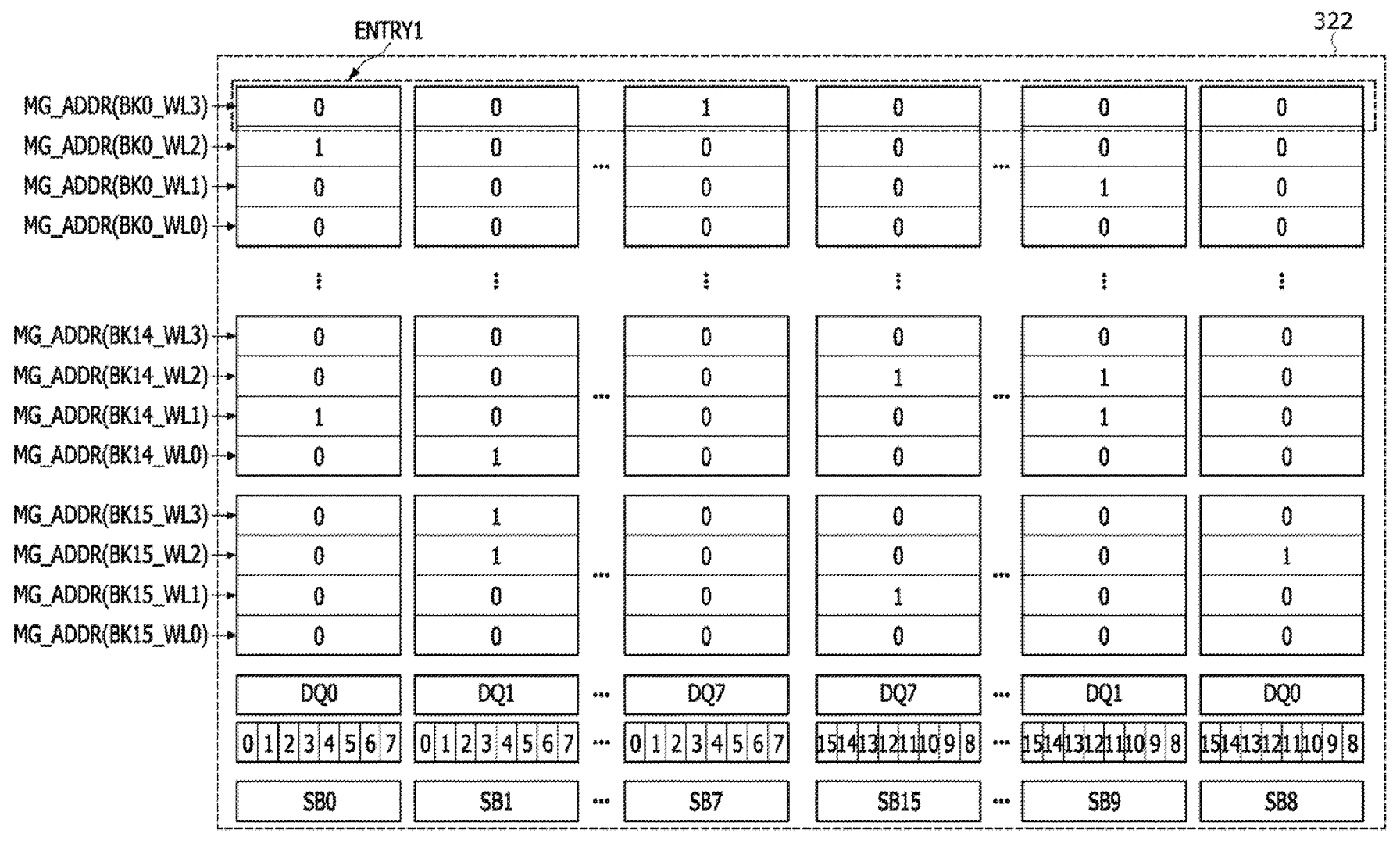

FIG. 4 is a schematic view illustrating the first reliability tracking table 322 of the reliability tracking circuit (RTC) 320 included in the memory system 10 of FIG. 1. Referring to FIG. 4, the first reliability tracking table 322 may include a plurality of first entries ENTRY1. The number of the first entries ENTRY1 may be equal to the total number of the row addresses of the memory medium 200. For example, as described with reference to FIG. 2, when the memory medium 200 is configured to include the first to sixteenth banks BANK0-BANK15, each of which has four row addresses, 64 first entries ENTRY1 may be disposed in the first reliability tracking table 322. Each of the first entries ENTRY1 may be comprised of the first reliability information on the matrix groups MGs (i.e., the symbols) having the same matrix group address MG_ADDR. The first reliability information may be comprised of a first binary stream having 'K' bits, the number of which is equal to the number of the symbols (i.e., the data I/O pins DQ) in the memory medium 200. For example, as described with reference to FIG. 2, when 128-bit data (i.e., 16 symbols) are outputted from the memory medium 200 through 16 data I/O pins DQ, each of the first entries ENTRY1 may be comprised of a first binary stream having 16 bits (i.e., a first 16-bit binary stream). In an embodiment, a first one of the first entries ENTRY1 indicated by a dotted line in FIG. 4 may have a matrix group address MG_ADDR corresponding to the fourth row address WL3 of the first bank BANK0 of the memory medium 200. That is, the bit values of a binary stream of '00 . . . 10 . . . 00' constituting the first one of the first entries ENTRY1 may denote the first reliability information on the matrix groups MGs (i.e., the symbols) having the fourth row address WL3 of the first bank BANK0 of the memory medium 200, respectively. In the present embodiment, the eighth symbol SB7 having the bit value of "1" in the first binary stream corresponding to the first one of the first entries ENTRY1 may be classified into the LRS.

Figure 5:
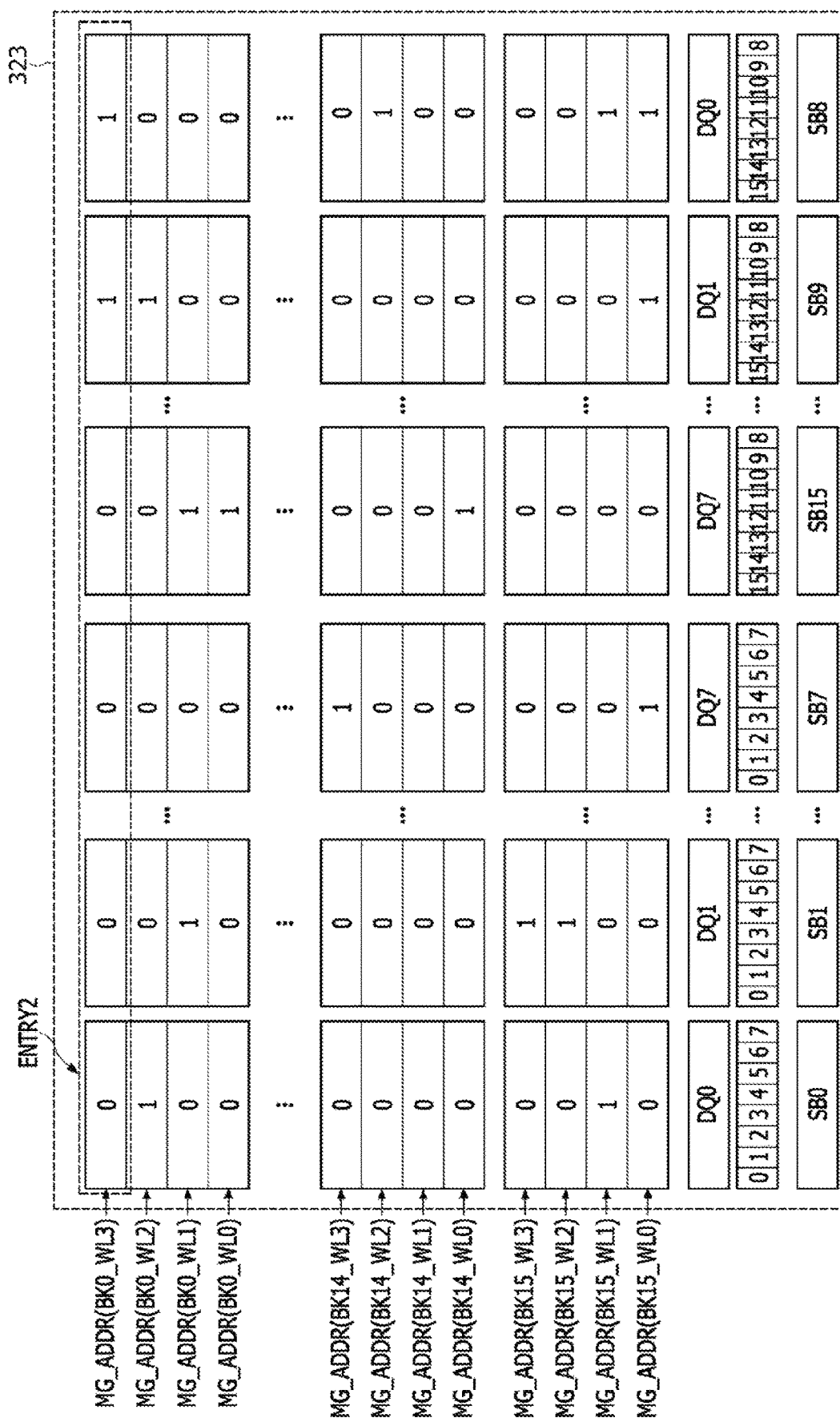
FIG. 5 is a schematic view illustrating a second reliability tracking table of a reliability tracking circuit included in a memory system according to an embodiment of the present disclosure.

FIG. 5 is a schematic view illustrating the second reliability tracking table 323 of the reliability tracking circuit 320 included in the memory system 10 of FIG. 1. The second reliability tracking table 323 may have the same configuration as the first reliability tracking table 322, but only the bit values stored in the second reliability tracking table 323 may be different from the bit values stored in the first reliability tracking table 322. Referring to FIG. 5, the second reliability tracking table 323 may include a plurality of second entries ENTRY2. The number of the second entries ENTRY2 may be equal to the total number of the row addresses of the memory medium 200. Each of the second entries ENTRY2 may be comprised of the second reliability information on the matrix groups MGs (i.e., the symbols) having the same matrix group address MG_ADDR. The second reliability information may be comprised of a second binary stream having 'K' bits, the number of which is equal to the number of the symbols (i.e., the data I/O pins DQ) in the memory medium 200. For example, as described with reference to FIG. 2, when 128-bit data (i.e., 16 symbols) are outputted from the memory medium 200 through 16 data I/O pins DQ, each of the second entries ENTRY2 may be comprised of a second binary stream having 16 bits (i.e., a second 16-bit binary stream). In an embodiment, a first one of the second entries ENTRY2 indicated by a dotted line in FIG. 5 may have a matrix group address MG_ADDR corresponding to the fourth row address WL3 of the first bank BANK0 of the memory medium 200. That is, the bit values of a binary stream of '00 . . . 00 . . . 11' constituting the first one of the second entries ENTRY2 may denote the second reliability information on the matrix groups MGs (i.e., the symbols) having the fourth row address WL3 of the first bank BANK0 of the memory medium 200, respectively. In the present embodiment, the ninth and tenth symbols SB8 and SB9 having the bit value of "1" in the second binary stream corresponding to the first one of the second entries ENTRY2 may be classified into the SRS.

Figure 6:
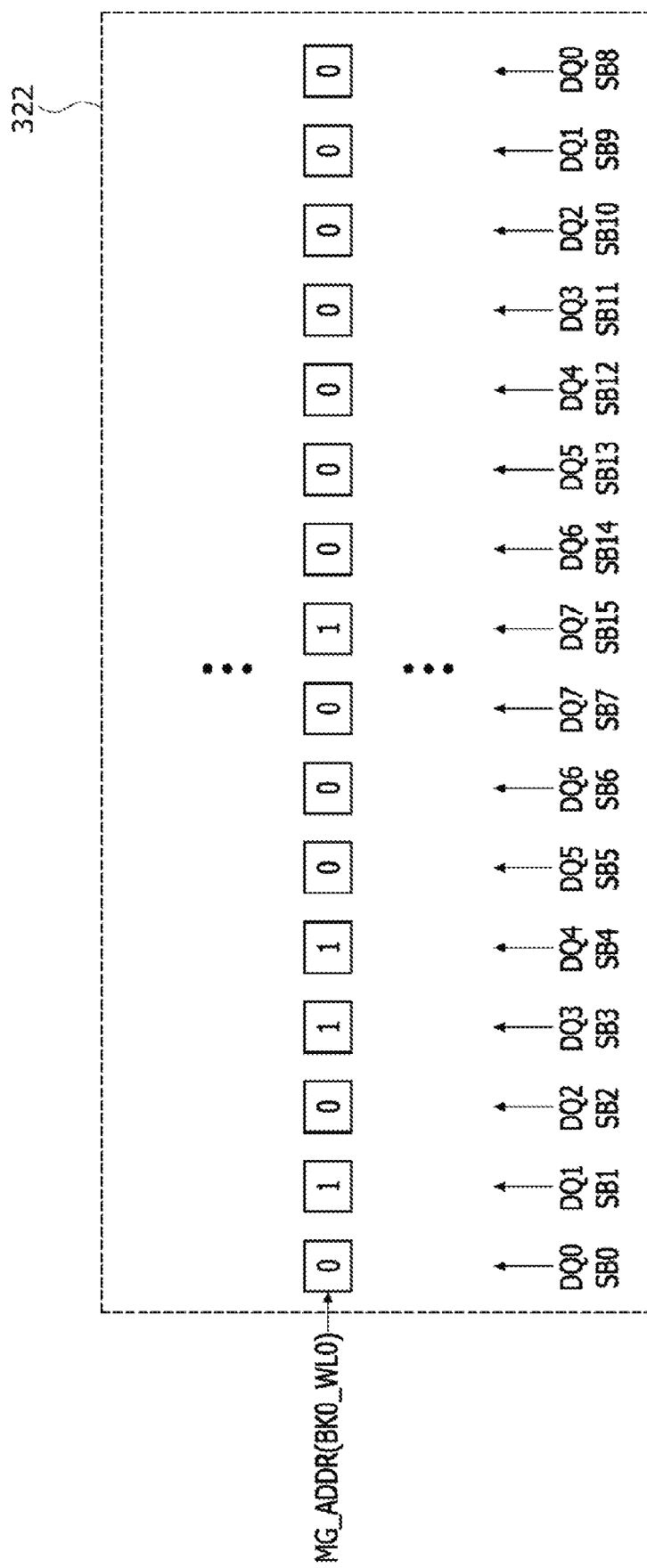
FIGS. 6 to 8 illustrate an example of a process for tracking symbols having a lowest reliability in a memory system according to an embodiment of the present disclosure.
Figure 7:
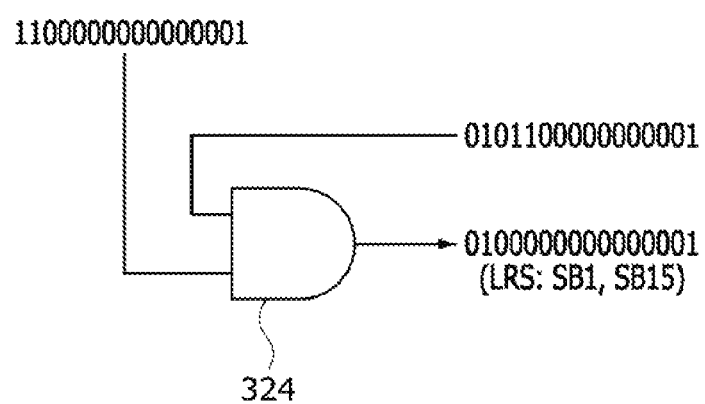
Figure 8:
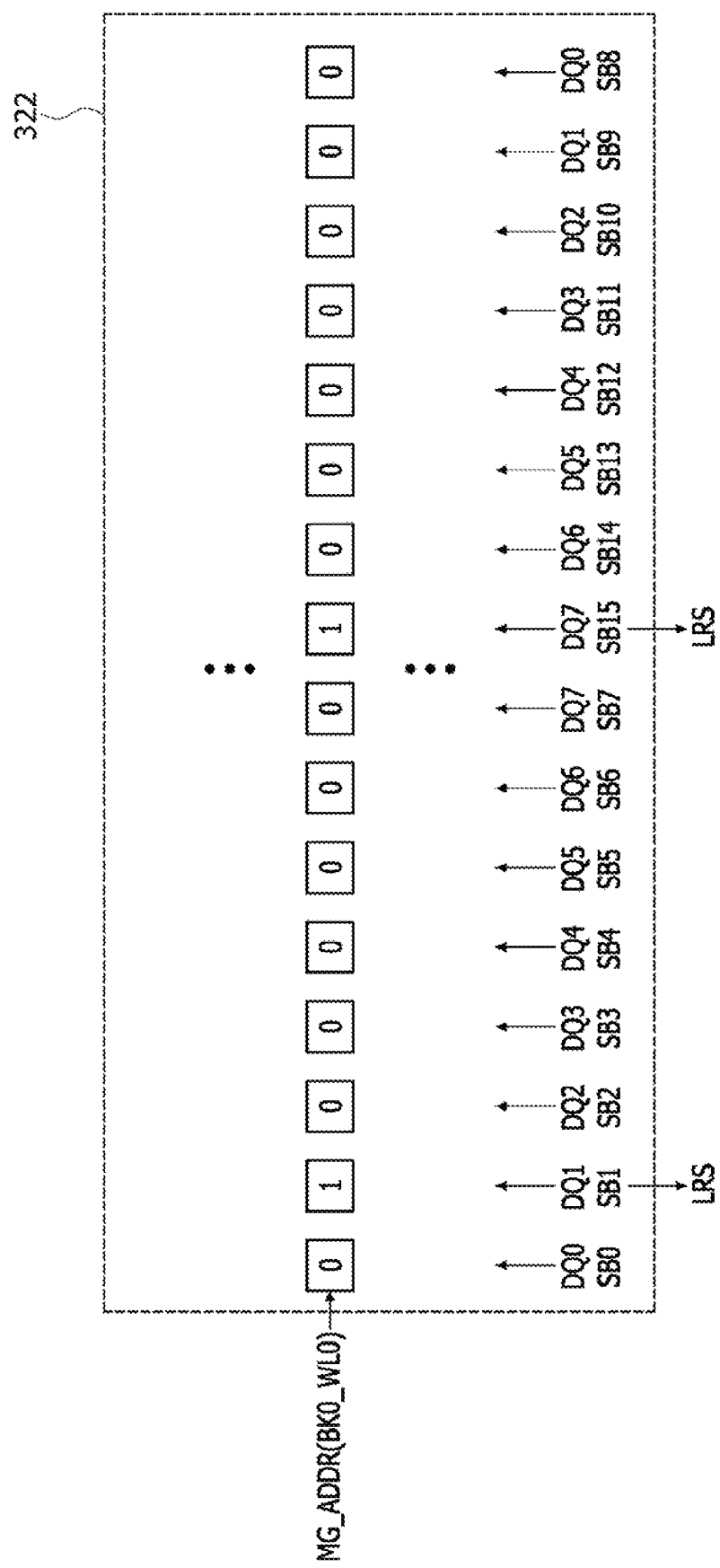

FIGS. 6 to 8 illustrate an example of a process for tracking the least reliable symbols (LRSs) in the memory system 10 of FIG. 1. First, as illustrated in FIG. 6, the process for tracking the least reliable symbols (LRSs) in the memory system 10 will be described hereinafter in conjunction with an example in which the first entry ENTRY1 having the matrix group address MG_ADDR corresponding to the first row address WL0 of the first bank BANK0 of the memory medium 200 is comprised of a binary stream of '0101100010000000'. Although the first entry ENTRY1 is expressed by a binary stream, each of the bit values of the binary stream constituting the first entry ENTRY1 may denote the first reliability information on each of the first to sixteenth symbols SB0-SB15. In the present embodiment, the second symbol SB1, the fourth symbol SB3, the fifth symbol SB4 and the sixteenth symbol SB15 having a bit value of "1" among the first to sixteenth symbols SB0-SB15 having the first row address WL0 of the first bank BK0 in the memory medium 200 may be classified into the least reliable symbols (LRSs).

In the status described above, error location data of the first to sixteenth symbols SB0-SB15 having the first row address WL0 of the first bank BK0 in the memory medium 200 may be transmitted from the tracking controller 321 to the first input terminal of the first logic arithmetic element 324, as illustrated in FIG. 7. In the error location data, an erroneous symbol may have a bit value of "1", and a normal symbol may have a bit value of "0". For example, it may be assumed that the first symbol SB0, the second symbol SB1 and the sixteenth symbol SB15 among the first to sixteenth symbols SB0-SB15 having the first row address WL0 of the first bank BK0 in the memory medium 200 are erroneous symbols and the remaining symbols are normal symbols. In such a case, the first symbol SB0, the second symbol SB1 and the sixteenth symbol SB15 of the error location data may have a bit value of "1", and the remaining symbols SB2-SB14 may have a bit value of "0". A sequence that the bit values of the error location data are inputted to the first logic arithmetic element 324 may be set to be different according to the embodiments. In the present embodiment, it may be assumed that the bit values corresponding to the first to sixteenth symbols SB0-SB15 are sequentially inputted to the first input terminal of the first logic arithmetic element 324. That is, the bit value "1" of the first symbol SB0 may be firstly inputted to the first logic arithmetic element 324, and the bit value "1" of the second symbol SB1 may be secondly inputted to the first input terminal of the first logic arithmetic element 324. In this way, the bit values from the bit value "0" of the third symbol SB2 to the bit value "1" of the sixteenth symbol SB15 may also be sequentially inputted to the first input terminal of the first logic arithmetic element 324.

The second input terminal of the first logic arithmetic element 324 may sequentially receive the first reliability information (stored in the first reliability tracking table 322) on the first to sixteenth symbols SB0-SB15 having the first row address WL0 of the first bank BK0 in the memory medium 200. A sequence that the bit values indicating the first reliability information are inputted to the first logic arithmetic element 324 may be set to be the same as the sequence that the bit values of the error location data are inputted to the first logic arithmetic element 324. Thus, the bit values indicating the first reliability information from the first symbol SB0 to the sixteenth symbol SB15 may be sequentially inputted to the second input terminal of the first logic arithmetic element 324. In case of the example illustrated in FIG. 6, the bit value "0" of the first symbol SB0 may be firstly inputted to the second input terminal of the first logic arithmetic element 324, and the bit value "1" of the second symbol SB1 may be secondly inputted to the second input terminal of the first logic arithmetic element 324. In this way, the bit values from the bit value "0" corresponding to the first reliability information on the third symbol SB2 to the bit value "1" corresponding to the first reliability information on the sixteenth symbol SB15 may be sequentially inputted to the second input terminal of the first logic arithmetic element 324.

The first logic arithmetic element 324 may perform a first logical operation (i.e., a logical AND operation) of the bit value of the error location data inputted to the first input terminal of the first logic arithmetic element 324 and the bit value of the first reliability information inputted to the second input terminal of the first logic arithmetic element 324, thereby outputting the result of the first logical operation as the updated first reliability information. In case of the present embodiment, the first logic arithmetic element 324 may firstly perform a logical AND operation of the bit value "1" of the error location data of the first symbol SB0 and the bit value "0" of the first reliability information of the first symbol SB0 to output a bit value "0" as an output datum. Next, the first logic arithmetic element 324 may secondly perform a logical AND operation of the bit value "1" of the error location data of the second symbol SB1 and the bit value "1" of the first reliability information of the second symbol SB1 to output a bit value "1" as an output datum. Similarly, the first logic arithmetic element 324 may thirdly perform a logical AND operation of the bit value "0" of the error location data of the third symbol SB2 and the bit value "0" of the first reliability information of the third symbol SB2 to output a bit value "0" as an output datum. In this way, the first logic arithmetic element 324 may sequentially perform the same logical AND operations for the fourth symbol SB3 to the fifteenth symbol SB14 to output bit values "0" as output data. Finally, the first logic arithmetic element 324 may then perform the same logical AND operation of the bit value "1" of the error location data of the sixteenth symbol SB15 and the bit value "1" of the first reliability information of the sixteenth symbol SB15 to output a bit value "1" as an output datum. As a result of the logical AND operations of the first logic arithmetic element 324, while the bits corresponding to the second and sixteenth symbols SB1 and SB15 outputted from the first logic arithmetic element 324 may have a value of "1", all of the bits corresponding to the remaining symbols SB0 and SB2-SB14 outputted from the first logic arithmetic element 324 may have a value of "0". Because the first logic arithmetic element 324 outputs the updated first reliability information, the second symbol SB1 and the sixteenth symbol SB15 having the bit value of "1" may be classified into the least reliable symbols (LRSs).

As illustrated in FIG. 8, the updated first reliability information sequentially outputted from the first logic arithmetic element 324 may be inputted to the first reliability tracking table 322. The first reliability information stored in the first reliability tracking table 322 may be replaced with the output data (i.e., the updated first reliability information) of the first logic arithmetic element 324. Thus, even though the second, fourth, fifth and sixteenth symbols SB1, SB3, SB4 and SB15 are classified into the least reliable symbols (LRSs) having a bit value of "1" in case of the example illustrated in FIG. 6, only the second and sixteenth symbols SB1 and SB15 may be classified into the least reliable symbols (LRSs) having a bit value of "1" after the first reliability information stored in the first reliability tracking table 322 is updated. In the present embodiment, because the first symbol SB0 was an erroneous symbol but not classified into the LRS, the first symbol SB0 may be still excluded from the LRS. Because the second and sixteenth symbols SB1 and SB15 are classified into the LRS and are erroneous symbols, the second and sixteenth symbols SB1 and SB15 may maintain the LRS status.

Because the fourth and fifth symbols SB3 and SB4 were classified into the LRSs but not erroneous symbols, the fourth and fifth symbols SB3 and SB4 may be excluded from the LRS.

Figure 9:
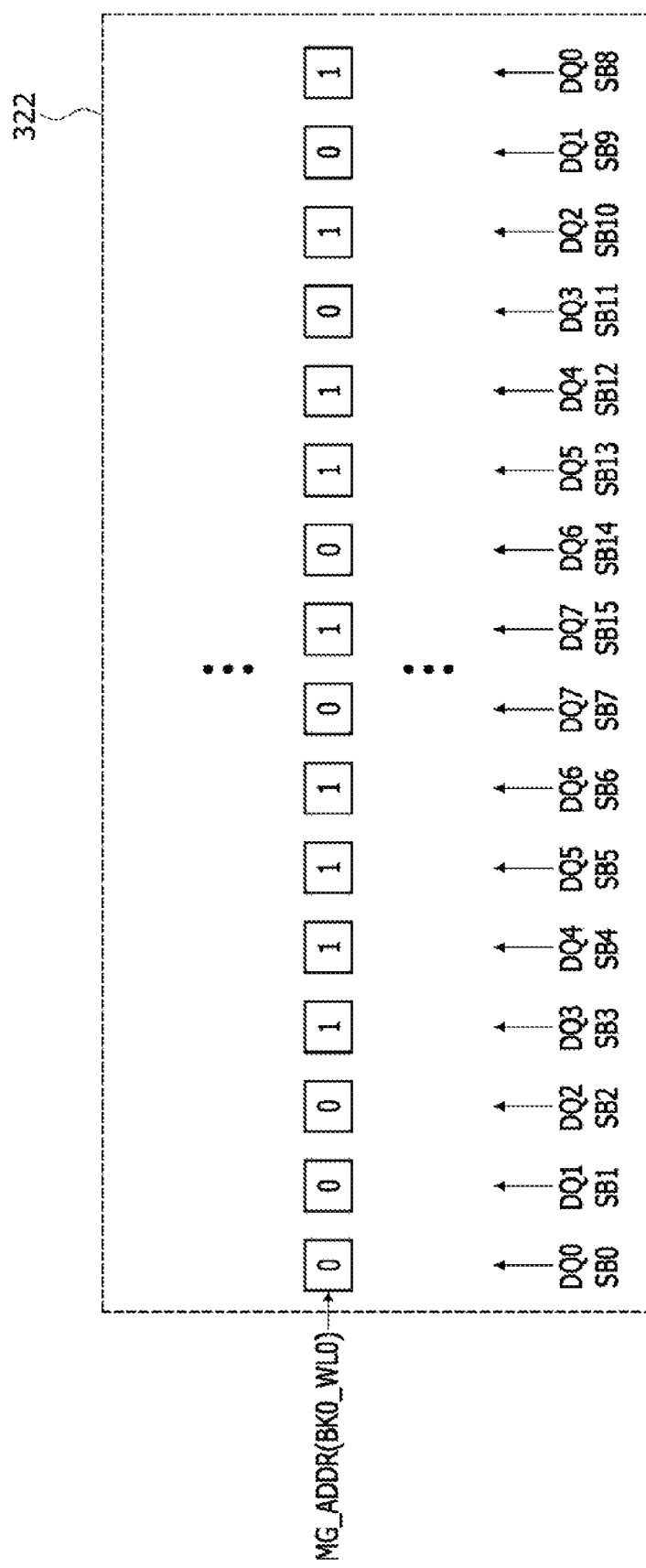
FIGS. 9 to 11 illustrate an example of a process for tracking symbols having a suspicious reliability in a memory system according to an embodiment of the present disclosure.
Figure 10:
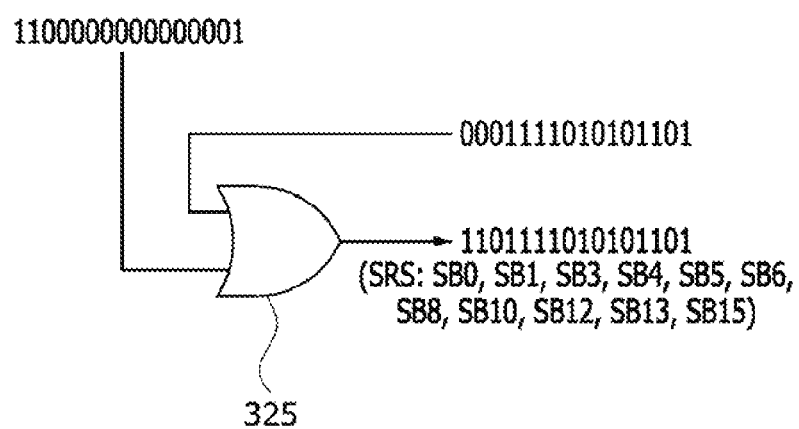
Figure 11:
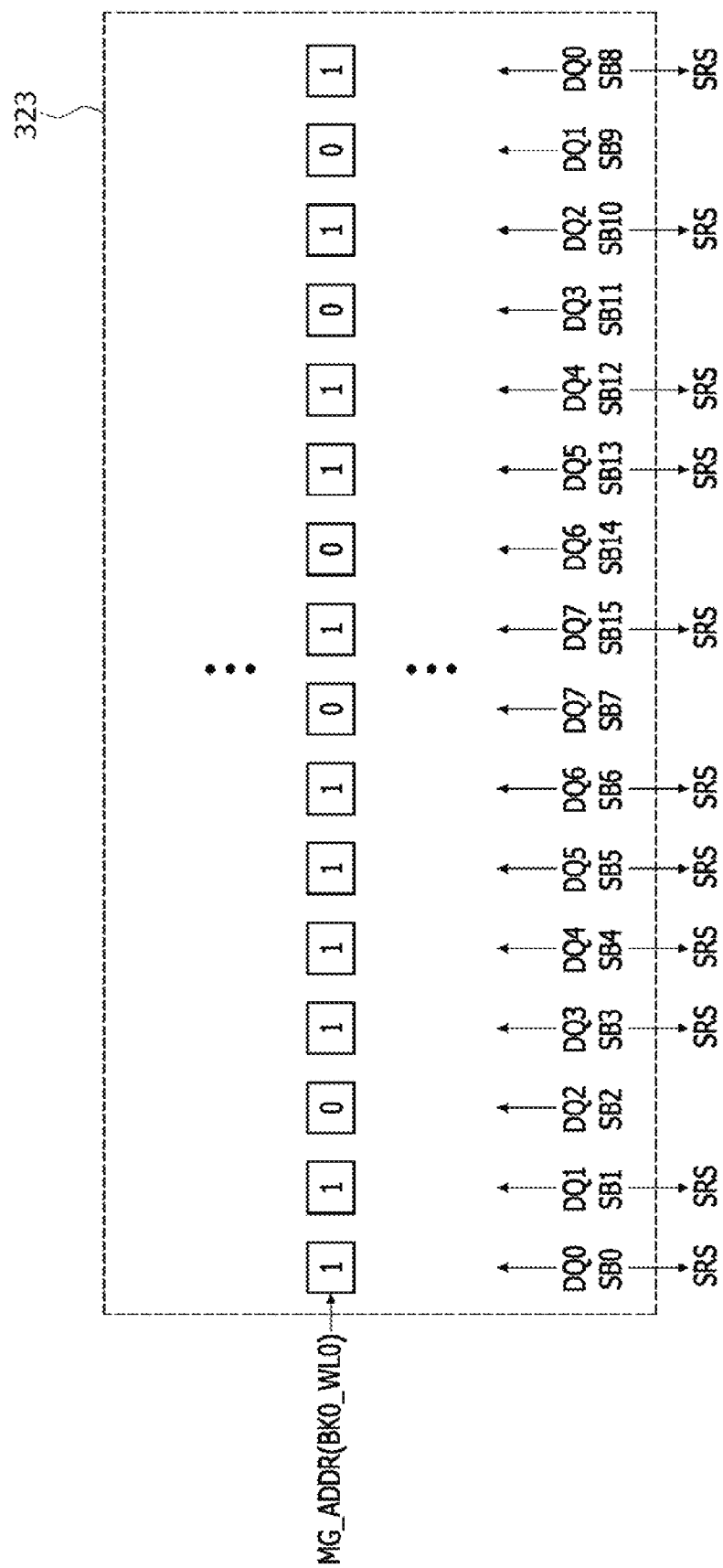

FIGS. 9 to 11 illustrate an example of a process for tracking the suspicious reliable symbols (SRSs) in the memory system 10 of FIG. 1. First, as illustrated in FIG. 9, the process for tracking the suspicious reliable symbols (SRSs) in the memory system 10 will be described hereinafter in conjunction with an example in which the second entry ENTRY2 having the matrix group address MG_ADDR corresponding to the first row address WL0 of the first bank BANK0 of the memory medium 200 is comprised of a binary stream of '0001111010110101'. Each of the bit values of the binary stream constituting the second entry ENTRY2 may denote the second reliability information on each of the first to sixteenth symbols SB0-SB15. In the present embodiment, the fourth to seventh symbols SB3-SB6, the ninth symbol SB8, the eleventh symbol SB10, the thirteenth symbol SB12, the fourteenth symbol SB13 and the sixteenth symbol SB15 having a bit value of "1" among the first to sixteenth symbols SB0-SB15 having the first row address WL0 of the first bank BK0 in the memory medium 200 may be classified into the suspicious reliable symbols (SRSs).

In the status described above, the error location data of the first to sixteenth symbols SB0-SB15 having the first row address WL0 of the first bank BK0 in the memory medium 200 may be transmitted from the tracking controller 321 to the first input terminal of the second logic arithmetic element 325, as illustrated in FIG. 10. In the error location data, the first symbol SB0, the second symbol SB1 and the sixteenth symbol SB15 may have a bit value of "1", and the remaining symbols SB2-SB14 may have a bit value of "0". In the present embodiment, the bit values corresponding to the first to sixteenth symbols SB0-SB15 may be sequentially inputted to the first input terminal of the second logic arithmetic element 325. The second input terminal of the second logic arithmetic element 325 may sequentially receive the second reliability information (stored in the second reliability tracking table 323) on the first to sixteenth symbols SB0-SB15 having the first row address WL0 of the first bank BK0 in the memory medium 200. A sequence that the bit values indicating the second reliability information are inputted to the second logic arithmetic element 325 may be set to be the same as the sequence that the bit values of the error location data are inputted to the second logic arithmetic element 325. Thus, the bit values indicating the second reliability information from the first symbol SB0 to the sixteenth symbol SB15 may be sequentially inputted to the second input terminal of the second logic arithmetic element 325. In case of the example illustrated in FIG. 6, the bit value "0" of the first symbol SB0 may be firstly inputted to the second input terminal of the second logic arithmetic element 325, and the bit value "0" of the second symbol SB1 may be secondly inputted to the second input terminal of the second logic arithmetic element 325. In this way, the bit values from the bit value "0" corresponding to the second reliability information on the third symbol SB2 to the bit value "1" corresponding to the second reliability information on the sixteenth symbol SB15 may be sequentially inputted to the second input terminal of the second logic arithmetic element 325.

The second logic arithmetic element 325 may perform a second logical operation (i.e., a logical OR operation) of the bit value of the error location data inputted to the first input terminal of the second logic arithmetic element 325 and the bit value of the second reliability information inputted to the second input terminal of the second logic arithmetic element 325, thereby outputting the result of the second logical operation as the updated second reliability information. In case of the present embodiment, the second logic arithmetic element 325 may firstly perform a logical OR operation of the bit value "1" of the error location data of the first symbol SB0 and the bit value "0" of the second reliability information of the first symbol SB0 to output a bit value "1" as an output datum. Next, the second logic arithmetic element 325 may secondly perform a logical OR operation of the bit value "1" of the error location data of the second symbol SB1 and the bit value "0" of the second reliability information of the second symbol SB1 to output a bit value "1" as an output datum. Similarly, the second logic arithmetic element 325 may thirdly perform a logical OR operation of the bit value "0" of the error location data of the third symbol SB2 and the bit value "0" of the second reliability information of the third symbol SB2 to output a bit value "0" as an output datum. In this way, the second logic arithmetic element 325 may sequentially perform the same logical OR operations for the fourth symbol SB3 to the fifteenth symbol SB14 to output the results of the logical OR operations as output data. Finally, the second logic arithmetic element 325 may then perform the same logical OR operation of the bit value "1" of the error location data of the sixteenth symbol SB15 and the bit value "1" of the second reliability information of the sixteenth symbol SB15 to output a bit value "1" as an output datum. As a result of the logical OR operations of the second logic arithmetic element 325, while the bits corresponding to the first and second symbols SB0 and SB1, the fourth to seventh symbols SB3-SB6, the ninth symbol SB8, the eleventh symbol SB10, the thirteenth symbol SB12, the fourteenth symbol SB13 and the sixteenth symbol SB15 outputted from the second logic arithmetic element 325 may have a value of "1", the bits corresponding to the remaining symbols SB2, SB7, SB9, SB11 and SB14 outputted from the second logic arithmetic element 325 may have a value of "0". That is, the first and second symbols SB0 and SB1, the fourth to seventh symbols SB3-SB6, the ninth symbol SB8, the eleventh symbol SB10, the thirteenth symbol SB12, the fourteenth symbol SB13 and the sixteenth symbol SB15 corresponding to the updated second reliability information outputted from the second logic arithmetic element 325 may be classified into the suspicious reliable symbols (SRSs).

As illustrated in FIG. 11, the updated second reliability information sequentially outputted from the second logic arithmetic element 325 may be inputted to the second reliability tracking table 323. The second reliability information stored in the second reliability tracking table 323 may be replaced with the output data (i.e., the updated second reliability information) of the second logic arithmetic element 325. Thus, even though the fourth to seventh symbols SB3-SB6, the ninth symbol SB8, the eleventh symbol SB10, the thirteenth symbol SB12, the fourteenth symbol SB13 and the sixteenth symbol SB15 are classified into the suspicious reliable symbols (SRSs) having a bit value of "1" before the update (see FIG. 9), the first and second symbols SB0 and SB1, the fourth to seventh symbols SB3-SB6, the ninth symbol SB8, the eleventh symbol SB10, the thirteenth symbol SB12, the fourteenth symbol SB13 and the sixteenth symbol SB15 may be classified into the suspicious reliable symbols (SRSs) having a bit value of "1" after the second reliability information stored in the second reliability tracking table 323 is updated. According to the present embodiment, the symbols classified into the suspicious reliable symbols (SRSs) before the update may still be classified into the suspicious reliable symbols (SRSs) even after the update regardless of error occurrence during the decoding operation. In addition, the symbols not classified into the suspicious reliable symbols (SRSs) before the update may be classified into the suspicious reliable symbols (SRSs) after the update if an error occurs during the decoding operation.

Figure 12:
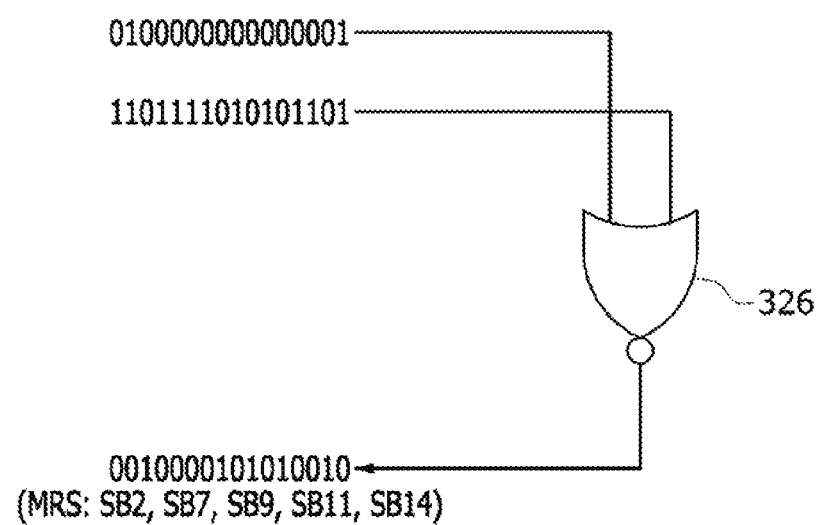
FIG. 12 illustrates an example of a process for tracking symbols having a highest reliability in a memory system according to an embodiment of the present disclosure.

FIG. 12 illustrates an example of a process for tracking the most reliable symbols (MRSs) in the memory system 10 of FIG. 1. Referring to FIG. 12, the updated first reliability information on the first to sixteenth symbols SB0-SB15 outputted from the first reliability tracking table (RTT_AND) 322 may be sequentially inputted to a first input terminal of the third logic arithmetic element 326, and the updated second reliability information on the first to sixteenth symbols SB0-SB15 outputted from the second reliability tracking table (RTT_OR) 323 may be sequentially inputted to a second input terminal of the third logic arithmetic element 326. The third logic arithmetic element 326 may perform logical NOR operations of the updated first reliability information and the updated second reliability information to sequentially output the results of the logical NOR operations. The output data of the third logic arithmetic element 326 may be inputted to the erasure control circuit 330.

In case of the example illustrated in FIGS. 8 and 11, the bit values of the binary stream '0100000000000001' corresponding to the updated first reliability information outputted from the first reliability tracking table (RTT_AND) 322 may be sequentially inputted to the first input terminal of the third logic arithmetic element 326, and the bit values of the binary stream '1101111010101101' corresponding to the updated second reliability information outputted from the second reliability tracking table (RTT_OR) 323 may be sequentially inputted to the second input terminal of the third logic arithmetic element 326. As the result of the logical NOR operations of the third logic arithmetic element 326, the third logic arithmetic element 326 may sequentially output bit values of a binary stream '0010000101010010'. According to the present embodiment, in the binary stream '0010000101010010' outputted from the third logic arithmetic element 326, the bit value of "1" means that both of the bits corresponding to the updated first reliability information and the updated second reliability information have a value of "0". That is, the symbol having the bit value of "1" in the output data of the third logic arithmetic element 326 might not be classified into any of the LRS and the SRS. Thus, the third, eighth, tenth, twelfth and fifteenth symbols SB2, SB7, SB9, SB11 and SB14 having a bit value of "1" outputted from the third logic arithmetic element 326 may be classified into the most reliable symbols (MRSs). In another embodiment, if the third logic arithmetic element 326 is realized using a NAND gate, the symbol having a bit value of "0" in the output data of the third logic arithmetic element 326 may be classified into the most reliable symbol (MRS).

FIG. 13 is a table illustrating a reliability distribution of the symbols SB0-SB15 inputted to the erasure control circuit 330 during the symbol tracking processes shown in FIGS. 6 to 12. Referring to FIG. 13, each of the symbols SB0-SB15 may be classified into the LRS, SRS or MRS according to the reliability thereof. The LRS may correspond to a symbol having a bit value of "1" as the updated first reliability information outputted from the first reliability tracking table (RTT_AND) 322. In the present embodiment, the second and sixteenth symbols SB1 and SB15 may be classified into the LRSs. The SRS may correspond to a symbol having a bit value of "1" as the updated second reliability information outputted from the second reliability tracking table (RTT_OR) 323. In the present embodiment, the first and second symbols SB0 and SB1, the fourth to seventh symbols SB3-SB6, the ninth symbol SB8, the eleventh symbol SB10, the thirteenth symbol SB12, the fourteenth symbol SB13 and the sixteenth symbol SB15 may be classified into the SRSs. The MRS may correspond to a symbol having a bit value of "1" as the output data of the third logic arithmetic element 326. In the present embodiment, the third, eighth, tenth, twelfth and fifteenth symbols SB2, SB7, SB9, SB11 and SB14 may be classified into the MRSs. According to the present embodiment, each of the second and sixteenth symbols SB1 and SB15 may be classified into the LRS as well as the SRS. As such, if one symbol is classified to have two reliability levels, a lower reliability level out of the two reliability levels may be prior to the two reliability levels.

Figure 14:
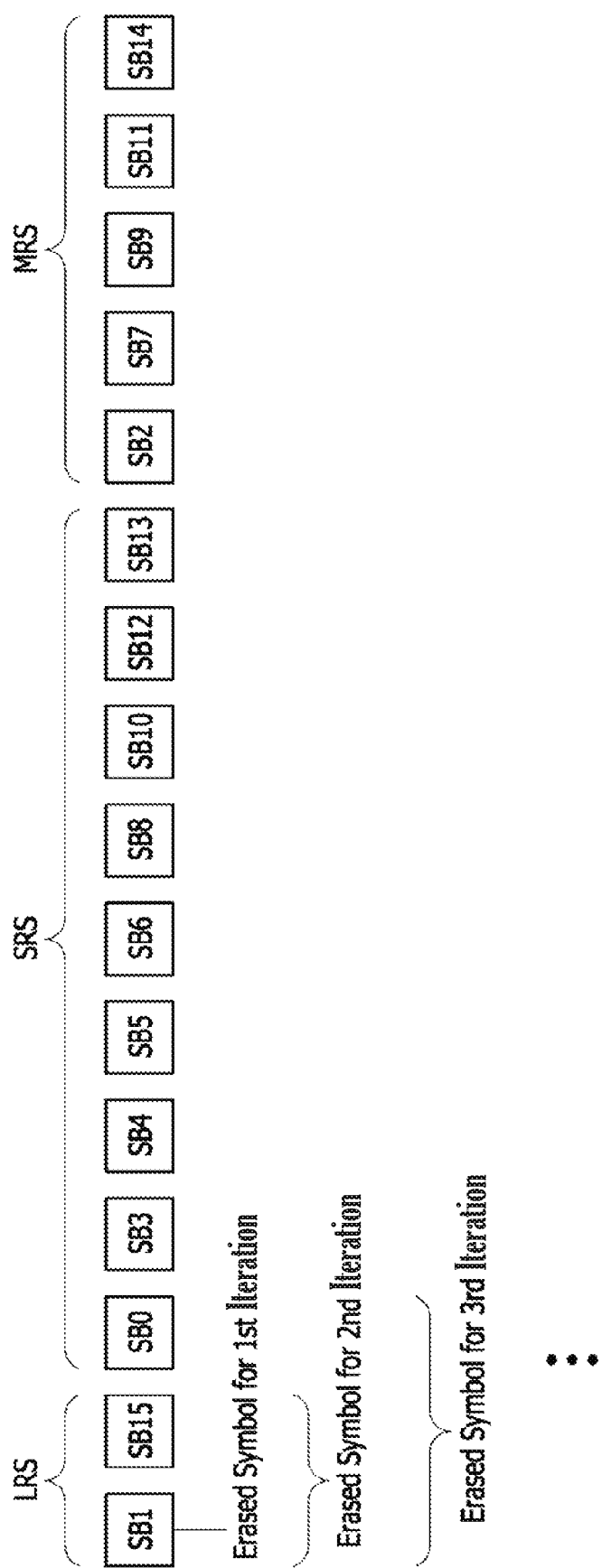
FIG. 14 illustrates an example of an erasure-based soft-decision decoding operation relative to the reliability distribution of symbols shown in FIG. 13.

FIG. 14 illustrates an example of an erasure-based soft-decision decoding operation relative to the reliability distribution of the symbols SB0-SB15 shown in FIG. 13. Referring to FIGS. 3 and 14, the erasure control circuit 330 receiving the data indicating the reliability distribution of the symbols SB0-SB15 may control the RS decoder 310 such that the RS decoder 310 performs the RS-SDD operation. The erasure control circuit 330 may sort the symbols in order of the symbol reliability from a low reliable symbol to a high reliable symbol (i.e., in sequence of the LRS, the SRS and the MRS) during the RS-SDD operation. This control operation of the erasure control circuit 330 may include an operation that provides the RS decoder 310 with information on the erasure sequence of the symbols. The RS decoder 310 may receive a control signal from the erasure control circuit 330 to erase one (e.g., the second symbol SB1) of the second symbol SB1 and the sixteenth symbol SB15 which are classified into the LRSs and to perform a first RS decoding operation (first iteration). If all of errors are not corrected by the first RS decoding operation, the RS decoder 310 may additionally erase the sixteenth symbol SB15 and may perform a second RS decoding operation (second iteration). If all of the errors are not corrected by the second RS decoding operation, the RS decoder 310 may additionally erase one (e.g., the first symbol SB0) of the first, fourth to seventh, ninth, eleventh, thirteenth and fourteenth symbols SB0, SB3-SB6, SB8, SB10, SB12 and SB13 which are classified into the SRSs and may perform a third RS decoding operation (third iteration). The RS decoder 310 may additionally erase the symbols one by one in order of the symbol reliability provided by the erasure control circuit 330 and may iteratively perform the RS decoding operation whenever one symbol is additionally erased until all of the errors are corrected.

Figure 15:
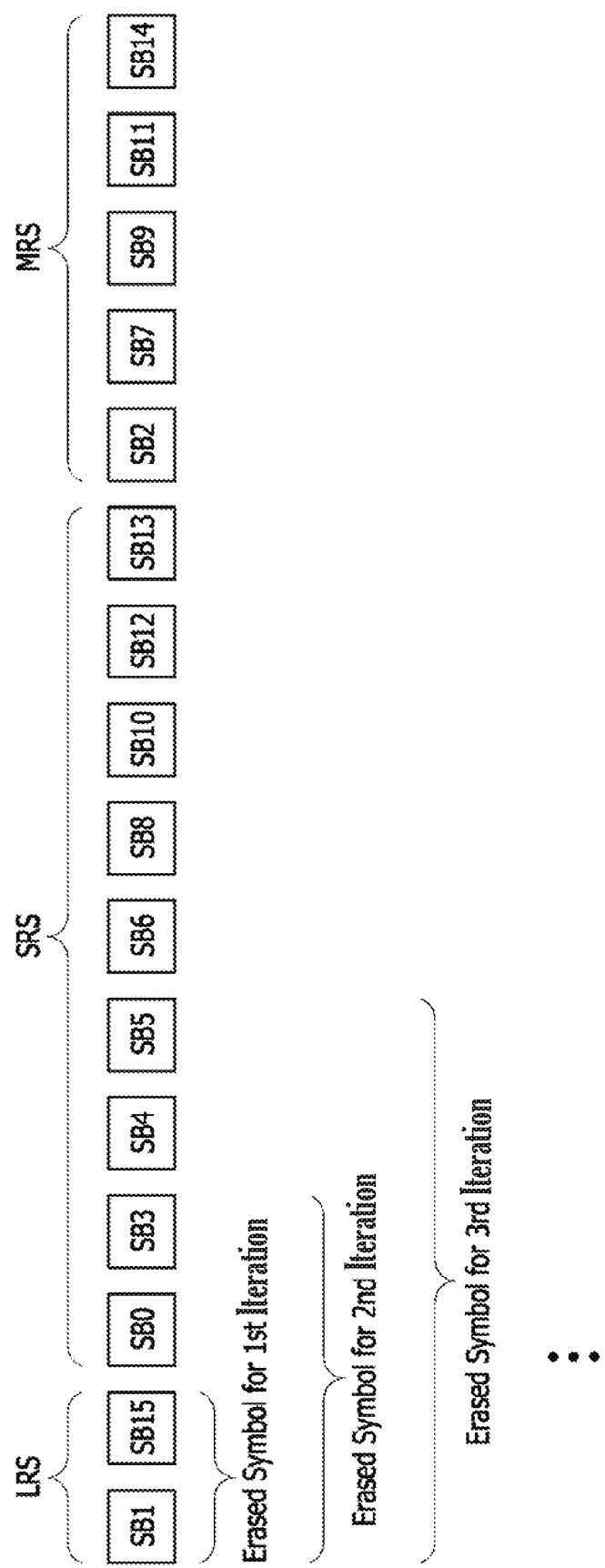
FIG. 15 illustrates another example of an erasure-based soft-decision decoding operation relative to the reliability distribution of symbols shown in FIG. 13.

FIG. 15 illustrates another example of the erasure-based soft-decision decoding operation relative to the reliability distribution of the symbols SB0-SB15 shown in FIG. 13. Referring to FIGS. 3 and 15, the erasure control circuit 330 may control the RS decoder 310 such that two symbols are erased by one RS decoding operation while the RS-SDD operation is performed. For example, the RS decoder 310 may receive a control signal from the erasure control circuit 330 to erase both of the second symbol SB1 and the sixteenth symbol SB15 which are classified into the LRSs and to perform a first RS decoding operation (first iteration). If all of errors are not corrected by the first RS decoding operation, the RS decoder 310 may additionally erase two (e.g., the first and fourth symbols SB0 and SB3) of the first, fourth to seventh, ninth, eleventh, thirteenth and fourteenth symbols SB0, SB3-SB6, SB8, SB10, SB12 and SB13 which are classified into the SRSs and may perform a second RS decoding operation (second iteration). If all of the errors are not corrected by the second RS decoding operation, the RS decoder 310 may additionally erase two (e.g., the fifth and sixth symbols SB4 and SB5) of the first, fourth to seventh, ninth, eleventh, thirteenth and fourteenth symbols SB0, SB3-SB6, SB8, SB10, SB12 and SB13 which are classified into the SRSs and may perform a third RS decoding operation (third iteration). The RS decoder 310 may additionally erase the symbols two by two in order of the symbol reliability provided by the erasure control circuit 330 and may iteratively perform the RS decoding operation whenever two symbols are additionally erased until all of the errors are corrected.

Figure 16:
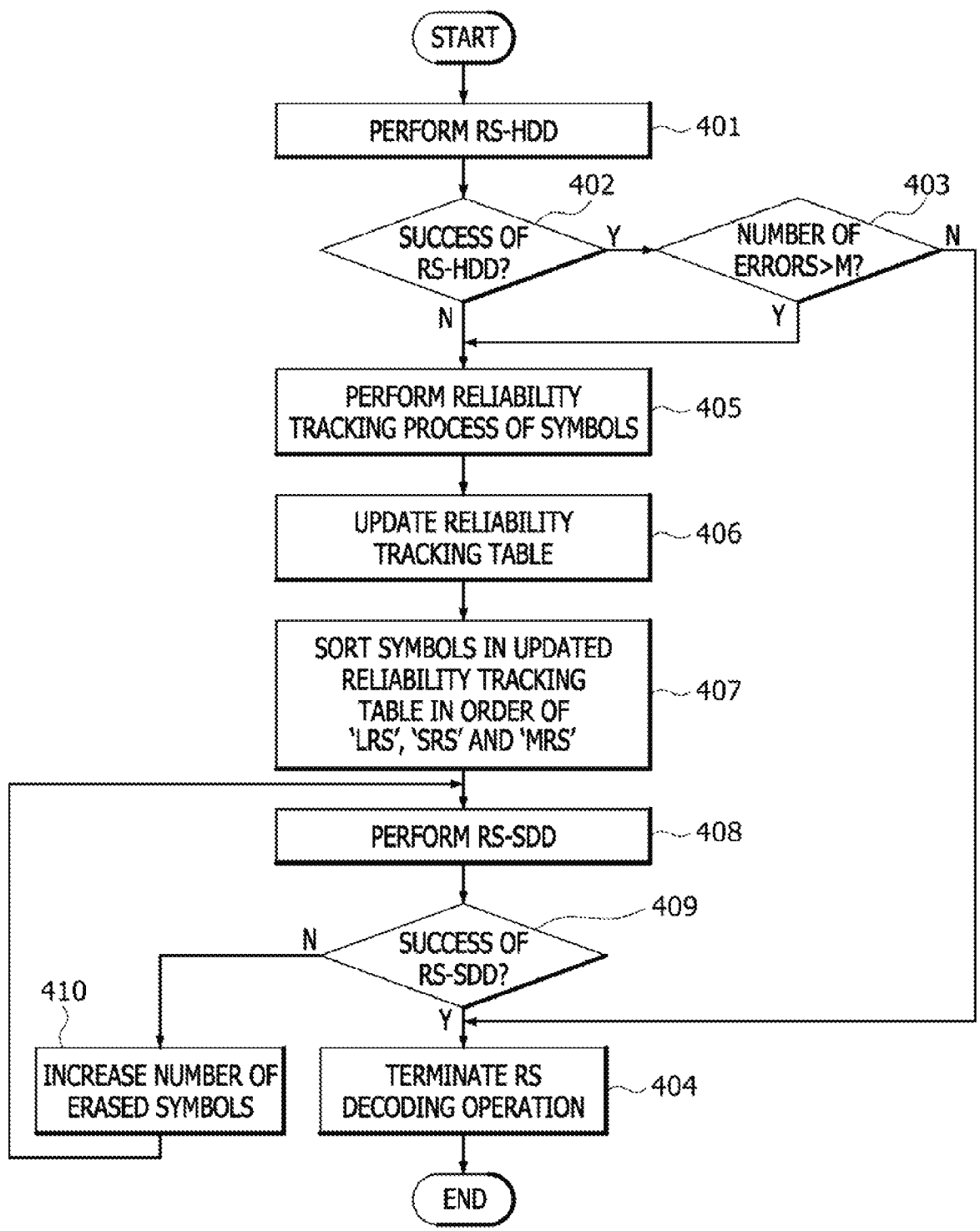
FIG. 16 is a flowchart illustrating a method of correcting errors in a memory system according to an embodiment of the present disclosure.

FIG. 16 is a flowchart illustrating a method of correcting errors in the memory system 10 shown in FIG. 1. Referring to FIGS. 3 and 16, the RS decoder 310 may receive the read data RDATA (i.e., a codeword) to perform the RS-HDD operation of the read data RDATA (see a step 401). Whether the RS-HDD operation is successfully performed (i.e., whether all of errors are corrected) may be discriminated (see a step 402). In the event that the RS-HDD operation is not successfully performed at the step 402, a process for tracking the reliability of the symbols may be performed (see a step 405). In the event that the RS-HDD operation is successfully performed at the step 402, whether the number of errors is greater than "M" may be discriminated (see a step 403). At the step 403, the number "M" may be voluntarily determined. In an embodiment, the number "M" may correspond to the number of errors which is able to be corrected by the RS-HDD operation. That is, the number "M" may correspond to the number of symbols which is close to an error correction capability. If the number of errors is not greater than the number "M" at the step 403, the RS decoding operation may terminate (see a step 404). If the number of errors is greater than the number "M" at the step 403, the step 405 may be performed.

At the step 405, the reliabilities of the symbols, each of which is comprised of a codeword, may be tracked. The processes for tracking the reliabilities of the symbols may be performed by the reliability tracking circuit 320. As described with reference to FIGS. 6 to 13, the updated first reliability information and the updated second reliability information may be generated during the processes for tracking the reliabilities of the symbols. After the step 405, the reliability tracking table may be updated (see a step 406). That is, the updated first reliability information and the updated second reliability information generated at the step 405 may be stored into respective ones of the first reliability tracking table (RTT_AND) 322 and the second reliability tracking table (RTT_OR) 323 to update the first and second reliability tracking tables 322 and 323. While the first and second reliability tracking tables 322 and 323 are updated, the third logic arithmetic element 326 may generate the output data informing of the MRSs. The erasure control circuit 330 may receive the updated first reliability information outputted from the first reliability tracking table 322, the updated second reliability information outputted from the second reliability tracking table 323, and the output data outputted from the third logic arithmetic element 326, thereby sorting the symbols in order of the symbol reliability from a low reliable symbol to a high reliable symbol (i.e., in sequence of the LRS, the SRS and the MRS) and providing the RS decoder 310 with information on the sequence of the symbols to be erased (see a step 407).

The RS decoder 310 may perform the RS-SDD operation in response to a control signal of the erasure control circuit 330 (see a step 408). Thus, a symbol having a lowest reliability among the LRSs, the SUSs and the MRSs may be erased and the RS decoding operation may be performed to correct errors. In such a case, the erased symbol may be one symbol or two or more symbols. Thereafter, whether the RS-SDD operation is successfully performed (i.e., whether all of errors are corrected by the RS-SDD operation) may be discriminated (see a step 409). If the RS-SDD operation is successfully performed at the step 409, the RS decoding process may terminate (see a step 404). If the RS-SDD operation is not successfully performed at the step 409, a symbol may be additionally erased (see a step 410) and the steps 408 and 409 may be performed. The steps 408, 409 and 410 may be iteratively performed until all of the errors are corrected.

The embodiments of the disclosed technology have been disclosed above for illustrative purposes. Those of ordinary skill in the art will appreciate that various modifications, additions, and substitutions are possible. While this patent document contains many specifics, these should not be construed as limitations on the scope or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A memory system comprising:
   a Reed-Solomon (RS) decoder configured to perform an error correction decoding operation of 'K'-number of symbols outputted from a memory medium (where, 'K' denotes a natural number);
   a reliability tracking circuit configured to generate and store information on a reliability of the symbols, error occurrence possibilities of which are distinguished into a plurality of different levels according to the error correction decoding operation performed by the RS decoder; and
   an erasure control circuit configured to control the RS decoder such that the symbols are erased in order of the reliability of the symbols from a low reliable symbol to a high reliable symbol and the error correction decoding operation is performed according to the information on the reliability of the symbols stored in the reliability tracking circuit.

2. The memory system of claim 1,
   wherein memory medium is configured to include a plurality of matrixes and 'K'- number of data input/output (I/O) pins;
   wherein each of the plurality of matrixes is configured to receive or output one-bit datum;
   wherein 'N'-bit data inputted to or outputted from 'N'-number of matrixes among the plurality of matrixes are transmitted through one of the data I/O pins (where, 'N' denotes a natural number); and
   wherein 'K×N'-bit data having the same row address are transmitted through all of the data I/O pins.

3. The memory system of claim 2, wherein each of the symbols is comprised of 'N'-bit data having the same row address and outputting through each of the data I/O pins.

4. The memory system of claim 1, wherein the reliability tracking circuit incudes:
   a first reliability tracking table configured to store first reliability information;
   a second reliability tracking table configured to store second reliability information;
   a tracking controller configured to receive an error code from the RS decoder and to output a matrix group address of the memory medium and error location data including error locations of matrix groups;
   a first logic arithmetic element configured to perform a first logical operation on the error location data outputted from the tracking controller and the first reliability information outputted from the first reliability tracking table to generate and output updated first reliability information to the first reliability tracking table;
   a second logic arithmetic element configured to perform a second logical operation on the error location data outputted from the tracking controller and the second reliability information outputted from the second reliability tracking table to generate and output updated second reliability information to the second reliability tracking table; and
   a third logic arithmetic element configured to perform a third logical operation on the updated first reliability information and the updated second reliability information to output the result of the third logical operation.

5. The memory system of claim 4,
   wherein the first logical operation comprises performing a logical AND operation on the error location data and the first reliability information to generate the updated first reliability information;
   wherein the second logical operation comprises performing a logical OR operation on the error location data and the second reliability information to generate the updated second reliability information; and
   wherein the third logic al operation comprises performing a logical NOR operation on the updated first reliability information and the updated second reliability information.

6. The memory system of claim 4,
   wherein the first logical operation comprises performing a logical AND operation on the error location data and the first reliability information to generate the updated first reliability information;
   wherein the second logical operation comprises performing a logical OR operation on the error location data and the second reliability information to generate the updated second reliability information; and
   wherein the third logical operation comprises performing a logical NAND operation on the updated first reliability information and the updated second reliability information.

7. The memory system of claim 4, wherein each of the matrix groups is comprised of 'N'-number of matrixes having the same row address and sharing one data I/O pin with each other among a plurality of matrixes included in in the memory medium.

8. The memory system of claim 7,
   wherein the first reliability tracking table includes a plurality of first entries, each of which is comprised of the first reliability information on some matrix groups having the same matrix group address among the matrix groups; and wherein the second reliability tracking table includes a plurality of second entries, each of which is comprised of the second reliability information on some matrix groups having the same matrix group address among the matrix groups.

9. The memory system of claim 8,
wherein the first reliability information constituting each of the first entries is comprised of a first binary stream including 'K'-number of bit values corresponding to respective ones of the symbols; and
wherein the second reliability information constituting each of the second entries is comprised of a second binary stream having 'K'-number of bit values corresponding to respective ones of the symbols.

10. The memory system of claim 9,
wherein the first reliability tracking table replaces the first reliability information stored therein with the updated first reliability information outputted from the first logic arithmetic element to update the first reliability information; and
wherein the second reliability tracking table replaces the second reliability information stored therein with the updated second reliability information outputted from the second logic arithmetic element to update the second reliability information.

11. The memory system of claim 10, wherein the erasure control circuit is configured to classify a symbol having a bit value of "1" among data transmitted from the first reliability tracking table to the third logic arithmetic element as a least reliable symbol (LRS), is configured to classify a symbol having a bit value of "1" among data transmitted from the second reliability tracking table to the third logic arithmetic element as a suspicious reliable symbol (SRS), and is configured to classify a symbol having a bit value of "1" among data outputted from the third logic arithmetic element as a most reliable symbol (MRS).

12. The memory system of claim 11, wherein the erasure control circuit controls the RS decoder such that the error correction decoding operation is performed with increasing the number of the symbols erased in sequence of the LRS, the SRS and the MRS.

13. The memory system of claim 11,
wherein the erasure control circuit controls the RS decoder such that the error correction decoding operation is performed with increasing the number of the symbols erased in sequence of the LRS, the SRS and the MRS; and
wherein the number of the symbols erased at a time is two or more.

14. A method of correcting errors in a memory system, the method comprising:
generating and storing information on a reliability of symbols by a reliability tracking circuit, the reliability of symbols including information for distinguishing the symbols into a plurality of different levels indicating error occurrence possibilities according to a result of a decoding operation of the symbols by a RS decoder outputted from a memory medium; and
erasing the symbols by a erasure control circuit in order of the symbol reliability from a low reliable symbol to a high reliable symbol and performing the RS decoding operation according to the information on the reliability of the symbols.

15. The method of claim 14, wherein generating and storing the information on the reliability of the symbols is executed when the decoding operation is not successfully performed or the number of errors is greater than a certain number.

16. The method of claim 14, wherein generating and storing the information on the reliability of the symbols includes:
generating a matrix group address of the memory medium and error location data including error locations of matrix groups based on an error code outputted from the RS decoder;
performing a first logical operation on first reliability information outputted from a first reliability tracking table and the error location data to store updated first reliability information corresponding to a result of the first logical operation into the first reliability tracking table;
performing a second logical operation on second reliability information outputted from a second reliability tracking table and the error location data to store updated second reliability information corresponding to a result of the second logical operation into the second reliability tracking table; and
performing a third logical operation on the updated first reliability information stored in the first reliability tracking table and the updated second reliability information stored in the second reliability tracking table to generate a result of the third logical operation.

17. The method of claim 16,
wherein the first logical operation is a logical AND operation;
wherein the second logical operation is a logical OR operation; and
wherein the third logical operation is a logical NOR operation.

18. The method of claim 16,
wherein the first logical operation is a logical AND operation;
wherein the second logical operation is a logical OR operation; and
wherein the third logical operation is a logical NAND operation.

19. The method of claim 16, wherein erasing the symbols and performing the RS decoding operation includes:
classifying a symbol having a bit value of "1" among the updated first reliability information as a least reliable symbol (LRS);
classifying a symbol having a bit value of "1" among the updated second reliability information as a suspicious reliable symbol (SRS);
classifying a symbol having a bit value of "1" among data corresponding to the result of the third logical operation as a most reliable symbol (MRS); and
performing the RS decoding operation with increasing the number of the symbols erased in sequence of the LRS, the SRS and the MRS.

20. The method of claim 16, wherein erasing the symbols and performing the RS decoding operation includes:
classifying a symbol having a bit value of "1" among the updated first reliability information as a least reliable symbol (LRS);
classifying a symbol having a bit value of "1" among the updated second reliability information as a suspicious reliable symbol (SRS);

classifying a symbol having a bit value of "1" among data corresponding to the result of the third logical operation as a most reliable symbol (MRS); and performing the RS decoding operation with increasing the number of the symbols erased in sequence of the LRS, the SRS and the MRS, wherein the number of the symbols erased at a time is two or more.

\* \* \* \* \*